United States Patent [19]
Lasky

[11] Patent Number: 5,888,875
[45] Date of Patent: Mar. 30, 1999

[54] DIFFUSION RESISTOR STRUCTURE WITH SILICIDED CONTACT AREAS, AND METHODS OF FABRICATION THEREOF

[75] Inventor: Jerome Bret Lasky, Essex Junction, Vt.

[73] Assignee: International Business Machines Corporation, Armonk, N.Y.

[21] Appl. No.: 898,264

[22] Filed: Jul. 22, 1997

Related U.S. Application Data

[62] Division of Ser. No. 522,768, Sep. 1, 1995.

[51] Int. Cl.⁶ .................................................. H01L 21/20
[52] U.S. Cl. ........................................... 438/383; 438/382
[58] Field of Search ................................. 438/238, 381, 438/382, 383, 384, 385

[56] References Cited

U.S. PATENT DOCUMENTS

| | | | |
|---|---|---|---|
| 4,070,653 | 1/1978 | Rao et al. | 365/222 |
| 4,070,748 | 1/1978 | Legat et al. | 29/577 |
| 4,370,798 | 2/1983 | Lien et al. | 29/576 B |
| 4,403,394 | 9/1983 | Shepard et al. | 29/571 |
| 4,432,073 | 2/1984 | Masuoka | 365/182 |
| 4,569,122 | 2/1986 | Chan | 29/277 |
| 5,003,361 | 3/1991 | Lancaster | 357/23.6 |
| 5,021,843 | 6/1991 | Ohmi | 357/23.1 |
| 5,185,294 | 2/1993 | Lam et al. | 437/193 |
| 5,200,733 | 4/1993 | Davis et al. | 338/64 |
| 5,258,635 | 11/1993 | Nitayama et al. | 257/329 |
| 5,396,093 | 3/1995 | Lu | 257/306 |

FOREIGN PATENT DOCUMENTS

| | | |
|---|---|---|
| 56-105667 | 12/1981 | Japan . |
| 60-89963 | 3/1985 | Japan . |
| 60-89965 | 8/1985 | Japan . |
| 4-258882 | 2/1992 | Japan . |

*Primary Examiner*—Joni Chang
*Attorney, Agent, or Firm*—Heslin & Rothenberg, P.C.

[57] ABSTRACT

This invention provides a diffusion resistor structure including a resistor-shaped diffusion having electrically integrated at opposite ends a first silicided contact area and a second silicided contact area. Polysilicon and oxide layers, or only an oxide layer, reside above a body region of the diffusion. The method provides for formation of the diffusion resistor with silicided contacts by utilizing a diffusion barrier layer which prevents diffusion into an overlying polysilicon layer when a subsequent dopant out diffusion step is performed. Selective etching is then utilized to remove the undoped polysilicon layer, leaving a polysilicon cap over the body region of the diffusion. A second region of the diffusion comprises the first contact area and second contact area, which are silicided once the body region is protected.

14 Claims, 2 Drawing Sheets

5,888,875

DIFFUSION RESISTOR STRUCTURE WITH SILICIDED CONTACT AREAS, AND METHODS OF FABRICATION THEREOF

This application is a division of application Ser. No. 08/522,768 filed Sep. 1, 1995 which application is now pending.

TECHNICAL FIELD

This invention is directed to methods of making semiconductor devices, and more particularly, to diffusion resistor structures with controlled resistivity and silicided contact areas, and to methods for fabricating the same.

BACKGROUND ART

In early semiconductor integrated circuits, resistors were provided by diffused regions or by portions of a semiconductor substrate defined by etchings. As the density of components in integrated circuits grew, the area occupied by resistors became prohibitive, so logic forms were favored since they employed few or no resistors. For example, transistor-transistor logic (TTL) and integrated injection logic ($I^2L$) in bipolar technology had features minimizing the area on a bar dedicated to resistors. In metal-oxide semiconductor (MOS) logic and memories, transistors are used as load devices. Numerous examples of complex MOS circuits containing large numbers of transistors, but no resistors, in a single chip digital processor or memory chip are known in the art. For improved versatility, however, it is desirable to provide diffusion type resistors for such chips, particularly for dynamic random access memory (DRAM) chips and integrated DRAM/logic chips.

One element of concern in the formation of diffusion resistors for DRAM or DRAM/logic chips is that the number of additional mask steps required to fabricate the structures be limited, and preferably that no additional mask processing be necessary other than that already required for the formation of the DRAM chip or DRAM/logic chip itself. With each additional mask, complexity increases. For example, elements on a chip must align within a few microns, and masks which are aligned in one portion of a wafer with respect to a previous masking operation may be out of registry in another portion of the wafer. Thus, it is important to limit the number of masks required to provide the on-chip diffusion resistor structure.

As another consideration, refractory metals and refractory metal suicides have often been used for interconnecting conductive structures. These materials posses low resistivity characteristics normally associated with metals such as aluminum and copper without providing the manufacturing challenges inherent in those materials. Typically, silicide electrodes are formed on silicon diffusion regions by depositing the refractory metal layer on the substrate, heating the metal to form silicide regions over the exposed silicon region, and treating the substrate in a wet etchant to remove unreacted refractory metal. When applied over a diffusion resistor, the silicide forming method possesses problems in that the resistance of the resultant structure is too low to be of general use, and the resistance can vary considerably from site to site. Thus, the usefulness of such a structure as a resistor is highly questionable.

Commonly assigned U.S. Pat. No. 5,185,294, entitled "Boron Out-Diffused Surface Strap Process," the entirety of which is hereby incorporated herein by reference, describes one process of interest. In this patent, a novel process is described for strap formation in a semiconductor device to electrically connect a first silicon region to a second silicon region when the regions are separated by a dielectric. This patent addresses the need for forming a low resistance connection between conductive structures, but does not address the fabrication of diffusion resistors.

Accordingly, there exists a need in the art to provide semiconductor diffusion resistor structures with controlled resistivity and silicided contact areas, without necessarily having an increase in the number of masking steps required to fabricate a semiconductor chip incorporating the structures.

DISCLOSURE OF INVENTION

Briefly summarized, in a first aspect of the present invention a diffusion resistor structure is provided having a resistor-shaped diffusion area extending within a semiconductor structure from an upper surface thereof. The diffusion area is electrically isolated within the semiconductor structure and includes a first region and a second region. The first region comprises the resistive body portion of the diffusion resistor structure, while the second region includes a first contact area and a second contact area. The first contact area and the second contact area are separated by the first region of the diffusion. A polysilicon layer overlies the first region of the diffusion area, and an oxide layer overlies the polysilicon layer. A silicide is formed over the second region of the diffusion area, such that the first contact area comprises a first silicided contact area and the second contact area comprises a second silicided contact area. Electrical contact to the diffusion resistor structure is made through the first silicided contact area and the second silicided contact area of the second region. In an alternate embodiment, the polysilicon layer is omitted so that only an oxide layer overlies the first region.

In another aspect, a method for fabricating a diffusion resistor structure is provided. This method includes: forming an isolated, resistor-shaped diffusion in a semiconductor structure adjacent to an upper surface thereof; forming a diffusion barrier layer over the semiconductor structure, the diffusion barrier layer being patterned such that a first region of the diffusion is exposed at the upper surface of the semiconductor structure, while a second region of the diffusion underlies the diffusion barrier layer; forming a polysilicon layer over the diffusion barrier layer and the first region of the diffusion; diffusing dopant from the first region into the polysilicon layer, thereby forming a doped polysilicon layer, wherein the diffusion barrier layer prevents diffusion of dopant from the second region of the diffusion; forming an oxide layer over the doped polysilicon layer; and, removing the diffusion barrier layer, and siliciding the second region of the diffusion from the upper surface of the semiconductor structure. The second region comprises a first contact area and a second contact area, which are separated by the first region of the diffusion. Electrical contact is made to the diffusion resistor structure through the silicided first contact area and the silicided second contact area.

As still another aspect, the invention comprises a method for fabricating a diffusion resistor structure which includes the steps of: forming an isolated, resistor-shaped diffusion in a semiconductor structure from an upper surface thereof; forming a mask layer over the diffusion; patterning and removing a portion of the mask layer to expose a first region of the diffusion at an upper surface of the semiconductor structure; forming an oxide layer above the first region of the diffusion; removing the mask layer from overlying a second region of the diffusion, the second region including a first contact area and a second contact area, the first contact area and the second contact area being separated by the first region of the diffusion; and siliciding the first contact area and the second contact area of the second region of the diffusion. Electrical contact is made to the diffusion resistor structure through the silicided first contact area and the silicided second contact area.

To restate, provided herein are diffusion resistor structures having controlled resistivity, yet silicided contact areas, along with methods for fabricating such structures. Improved resistivity control is attained by isolating the body of the diffusion resistor from silicidation commensurate with siliciding of the contact areas. Various implementations are presented herein for accomplishing this. Advantageously, overlaying polysilicon or an oxide layer above a main body portion of the diffusion resistor does not significantly effect resistivity thereof. Further, dependent upon the semiconductor fabrication process with which the diffusion resistor structure is to be integrated, no additional masking steps may be required. For example, a diffusion resistor structure in accordance with this invention may be fabricated for a dynamic random access memory (DRAM) chip or DRAM/ logic chip in accordance with present technology, without requiring additional mask steps.

BRIEF DESCRIPTION OF THE DRAWINGS

These and other objects, advantages and features of the present invention will be more readily understood from the following detailed description of certain preferred embodiments of the invention, when considered in conjunction with the accompanying drawings in which.

BEST MODE FOR CARRYING OUT THE INVENTION

Figure 1:
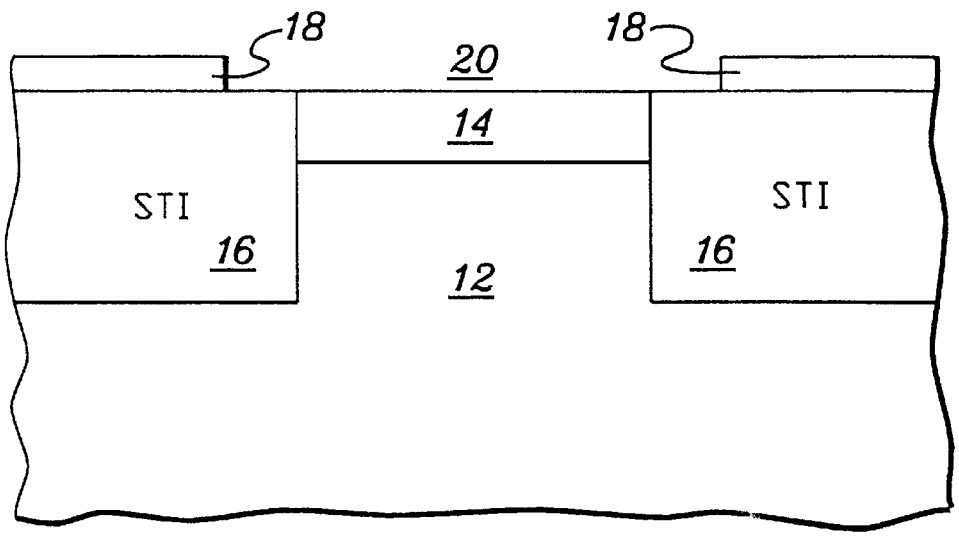
FIG. 1 is a cross-sectional view of a resistor-shaped diffusion in a semiconductor substrate isolated by shallow trench isolation (STI) and above which has been formed a patterned nitride layer.
Figure 2:
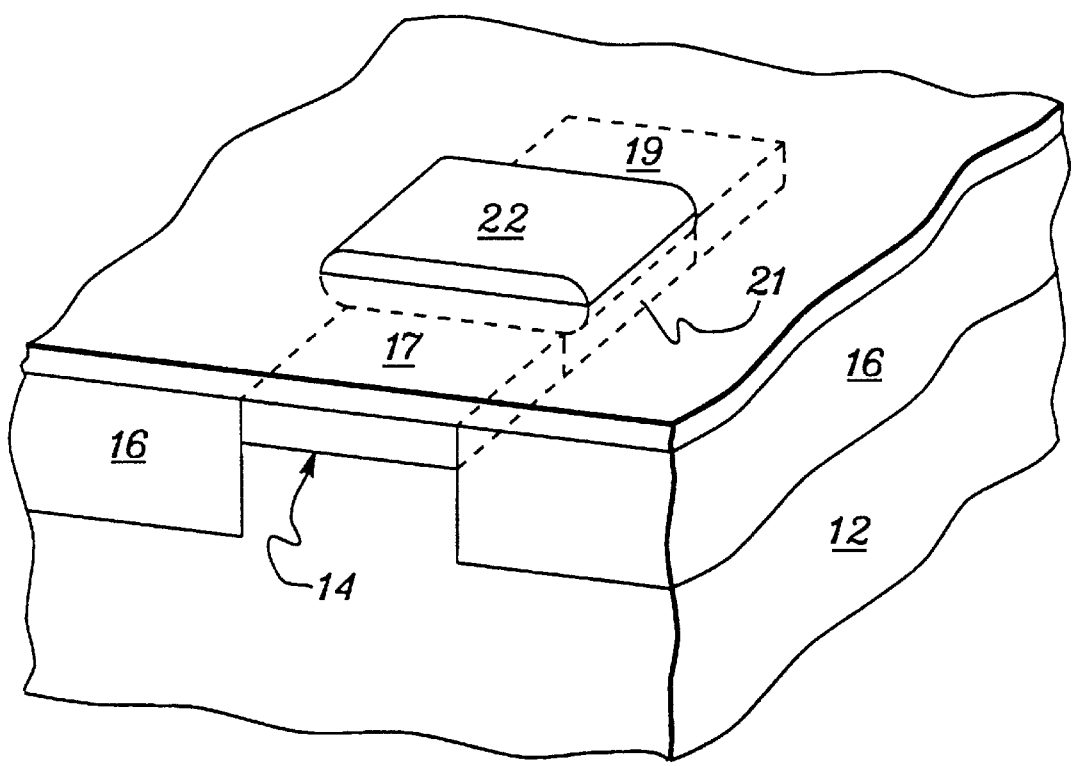
FIG. 2 is a partial perspective view of the semiconductor structure of FIG. 1 subsequent to formation of a polysilicon layer above a first region of the diffusion.

As used in the subject application, doping refers to the addition of impurities to a semiconductor material. Doping allows the manufacture of N-type and P-type semiconductors with varying degrees of conductivity/- resistivity. In general, the greater the extent of doping, the higher the conductivity and the lower the resistivity. As is well known, an N-type material refers to a semiconductor material that has been doped with a donor-type impurity and, consequently, conducts current via electrons. A P-type material refers to a semiconductor material that has been doped with an acceptor-impurity and, consequently, conducts current via hole migration.

Etching refers to chemically eating away a metal to form a desired pattern, such as an etched circuit. RIE refers to reactive ion etching. Selective etching refers to the use of etching, for example, in the manufacture of particular circuit components, i.e., to remove selected portions of one material from another in a semiconductor structure. Silicon, as used in this application, includes polysilicon (polycrystalline silicon), amorphous silicon (non-crystalline silicon) and monocrystalline silicon. Such silicon may be N- or P-doped, or undoped.

As noted above, the broad concept of the subject invention is directed to a buried diffused resistor structure and method for fabricating such a structure, wherein silicided contact areas are provided at opposites ends of a resistor-shaped diffusion. The silicided contact areas are exposed for electrical connection to the buried diffusion resistor structure. The method broadly comprises the steps of:

(a) doping an exposed surface of a silicon structure to define a resistor-shaped diffusion;

(b) depositing a continuous diffusion barrier layer over the upper surface of the silicon structure;

(c) etching the diffusion barrier layer so as to selectively remove a portion of the diffusion barrier layer over a first region of the buried diffusion in the silicon structure, thereby exposing the underlying silicon surface;

(d) implanting a dopant into the first region of the diffusion;

(e) depositing a continuous layer of polysilicon over the diffusion barrier layer and also over the exposed underlying surface of the first region;

(f) diffusing implanted dopant from the first region of the diffusion into the continuous layer of polysilicon, wherein unremoved portions of the diffusion barrier layer prevent diffusion of the dopant into that potion of the continuous layer of polysilicon overlying the unremoved portions of the diffusion barrier layer;

(g) etching the resulting structure to selectively remove the continuous layer of polysilicon containing no diffused dopant, thereby leaving the doped portion of the continuous layer of polysilicon overlying the exposed surface of the first region of the buried diffusion;

(h) forming an oxide layer over the remaining polysilicon layer; and (i) etching the then-resultant structure to remove any remaining diffusion barrier layer, thereby exposing a second region of the buried diffusion, and then siliciding the second region such that a first silicided contact area and a second silicided contact area are defined, the first silicided contact area and the second silicided contact area being separated by the first region of the buried diffusion, wherein the first region comprises the resistive body of the diffusion resistor structure.

As an alternative, the implanting of dopant, depositing of polysilicon, and out-diffusing of dopant into the polysilicon could be omitted such that oxidation would occur directly on the exposed surface of the first region of the buried diffusion.

The semiconductor structure preferably comprises a silicon substrate which is doped with Boron using ion implantation to define the diffusion area. Alternatively, the dopant can comprise $BF_2$, in which case an annealing step is required to outgas the fluorine. Also, it is possible to dope the exposed surfaces of the diffusion after steps (b) and (c) instead of prior thereto. In either case, the dopant is applied at the location where the diffusion resistor is to be formed and the dopant is available for diffusion as discussed herein.

The continuous diffusion barrier layer in one embodiment comprises silicon nitride, but could also comprise aluminum oxide or silicon dioxide. The diffusion barrier layer is preferably deposited using chemical vapor deposition.

A mask is then applied over the diffusion barrier layer to define a pattern in said layer which results in exposure of the first region of the buried diffusion (i.e., the body of the diffusion resistor). A continuous layer of polysilicon is then deposited over the remaining diffusion barrier layer and also over the underlying surface exposed by the partial removal of the diffusion barrier layer. Preferably, this deposition comprises chemical vapor deposition.

An important step in the method employing a polysilicon layer, is the diffusion of the dopant from the first region of the buried diffusion into the overlying layer of polysilicon. The dopant will not diffuse through the remaining diffusion barrier layer, rather only into the continuous layer of polysilicon corresponding to the position where the diffusion barrier layer had previously been etched away. Preferably, this out diffusion comprises annealing the structure at about 875°–900° C. for about five minutes, which results in a diffusion of the Boron to a distance of about 0.2 microns into the layer of polysilicon.

The resulting structure is then wet etched, for example with potassium hydroxide/isopropyl alcohol (KOH/IPA) or other suitable alcohol, or ethylenediamine, pyrocatechol and water (EPW), so as to remove the portions of the continuous layer of polysilicon into which no dopant diffused. Thus, the only remaining portion of the polysilicon layer is that portion corresponding to the position where the diffusion barrier layer had previously been etched away. The polysilicon is then oxidized and the remaining diffusion barrier layer is etched away, preferably using reactive ion etching. Upon removal of the diffusion barrier layer, a second region of the diffusion is silicided, for example, forming titanium silicide ($TiSi_2$). The resultant silicided areas comprise a first contact area and a second contact area, which are spaced near opposite ends of the diffusion resistor structure. These contact areas are separated by the first region of the diffusion, which again comprises the body of the resistor. When in use, current flows from the first contact area through the first region of the diffusion to the second contact area. Silicidation of the first contact area and second contact area facilitates electrical connection to the diffusion resistor.

One embodiment of a diffusion resistor structure, and its method of fabrication, is depicted in FIGS. 1–4, wherein the same reference numbers are used throughout multiple figures to designated the same or similar components. Further, for clarity these figures are not necessarily drawn to scale. As shown in FIG. 1, a diffusion area 14, is defined within a semiconductor structure, such as a silicon substrate or well 12. This diffusion 14 is isolated, in this case by shallow trench isolation (STI) 16. A patterned diffusion barrier layer 18 overlies an upper surface of the semiconductor structure. As noted above, this diffusion barrier layer 18 may comprise nitride. In the transverse cross-sectional view shown, layer 18 is patterned with an opening 20 to expose an upper surface of diffusion 14. Diffusion 14 is assumed to have been Boron ion implanted to have a surface concentration well above solid solubility. In one embodiment, 2 E15 $BF_2$ at 10 keV can be employed.

More particularly, after the Boron is implanted (but not annealed), the layer of nitride could be deposited using low pressure chemical vapor deposition (LPCVD), preferably forming silicon nitride to a thickness of approximately 250 Å. Subsequently, a layer of resist is applied to serve as a mask for a reactive ion etching of the nitride layer. A center portion of the buried diffusion, which serves as the body of the diffusion resistor, is exposed by etching the nitride in that area. FIG. 1 depicts the resultant semiconductor structure after the resist layer has been removed.

After removal of the resist layer, a layer of intrinsic polysilicon is applied over the entire structure using LPCVD. In one embodiment, the deposited polysilicon is 1200 Å thick. After deposition of polysilicon, Boron is out diffused from the exposed portion of diffusion 14. As one example, out diffusion can be accomplished by annealing the structure at 900° C. for five minutes.

After out diffusion of dopant, the semiconductor structure is wet etched, for example, using potassium hydroxide/isopropyl alcohol (KOH/IPA) or other suitable alcohol or ethylenediamine, pyrocatechol and water (EPW), to remove "lightly doped" polysilicon. The lightly doped polysilicon is that polysilicon which has not been further doped during the Boron out diffusion step, i.e., the diffusion deposited over the nitride layer. The remaining polysilicon corresponds to area 22 in FIG. 2, and in this simplified example represents the area over the body of the diffusion resistor.

Figure 3:
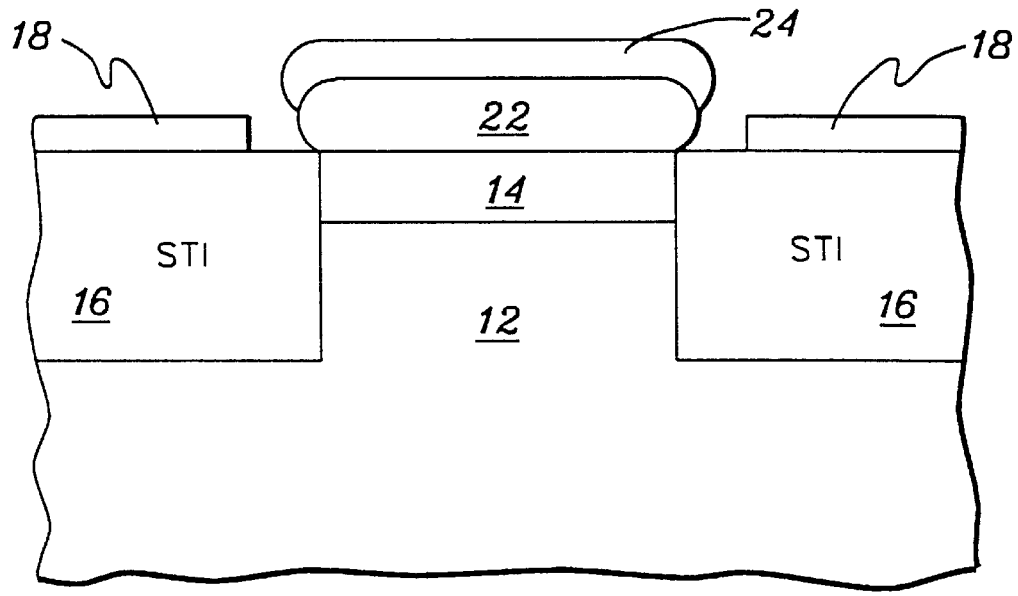
FIG. 3 is a cross-sectional view of the semiconductor structure of FIG. 2 subsequent to formation of an oxide layer overlying the polysilicon layer above the first region of the diffusion.
Figure 4:
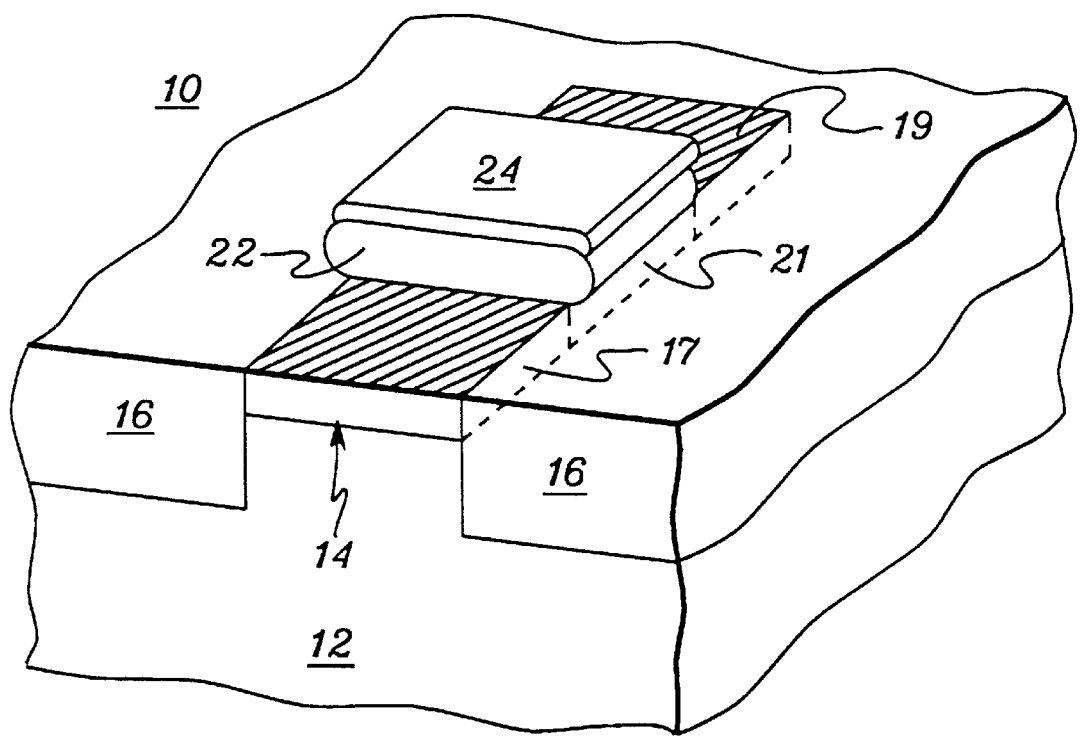
FIG. 4 is a partial perspective view of one diffusion resistor structure in accordance with the present invention, obtained subsequent to removal of the nitride layer from the semiconductor structure of FIG. 3 and formation of a silicide layer at a first contact area and a second contact area of a second region of the diffusion.

The remaining polysilicon 22 is then oxidized, forming a protective oxide layer 24 overlying the polysilicon layer (see FIG. 3). RIE is utilized to remove the remaining nitride layer resulting in an exposed second region of the diffusion area. The second region comprises a first contact area 17 and a second contact area 19. Area 17 and area 19 are separated by the main body 21 of the diffusion resistor, i.e., the first region of the diffusion area. A layer of titanium silicide is then applied over the exposed silicon regions 17 and 19 (see FIGS. 2 and 4). Specifically, a layer of titanium is deposited over the entire structure and heated to cause a reaction between the titanium and any exposed underlying silicon. This results in titanium silicide at the first contact area 17 and the second contact area 19 of the diffusion resistor. The unreacted titanium is removed using any suitable means known to those skilled into the art. The resultant diffusion resistor structure, generally denoted 10, is depicted in FIG. 4. Again, those skilled in the art will recognize from the discussion presented herein that structure 10 of FIG. 4 is merely one implementation of the concepts presented. Various diffusion resistor configurations can be readily conceived without departing from the scope of the present invention.

Each of the steps outlined herein can be optimized to define the process window. For example, the purpose of the additional ion implantation at the P+ junction formation is to provide a reservoir of Boron which will last throughout the out diffusion step. Since the standard semiconductor junction already raises the concentration above solid solubility, this additional ion implantation causes no change in the junction depth. For an ion implantation of 1 E15 or greater there is no increase in dimensions of the buried diffusion. That is, for doses greater than this, the Boron reservoir has not been depleted at the end of the diffusion.

If $BF_2$ is used for the high dose ion implantation, a fluorine outgas anneal is required. Preferred conditions for the fluorine outgas anneal are 700° C. for twenty minutes, but his can be replaced by a hold in the low pressure nitride deposition after insertion but before putting on the reactant vapors.

In the example above, diffusion area 14 is assumed to comprise a P+ doped material. As an alternative, the process presented herein could be employed over an N+ diffusion. In such a case, there may not be sufficient Boron out diffusion into the polysilicon for the polysilicon to remain above the N+ diffusion after KOH/IPA etching. However, there will be sufficient Boron to stop the KOH/IPA etching at the silicon interface. The result is an oxide layer overlying an N+ junction, which would be one form of a resistor in accordance with the present invention.

As briefly noted above, an alternative approach to implementing the broad concept of the subject invention is to omit the layer of polysilicon and form an oxide directly over the first region (21) of the buried diffusion resistor. This alternative results in a simplified fabrication process, which includes the steps of:

(a) depositing a mask layer over an upper surface of a semiconductor structure comprising an isolated diffusion in a substrate or well;

(b) etching the mask layer to selectively remove a portion thereof over a first region of the isolated diffusion, the first region to form the body of the diffusion resistor;

(c) oxidizing the exposed surface of the silicon in the first region of the diffusion;

(d) removing the mask layer from over a second region of the diffusion, the second region comprising a first contact area and a second contact area, which are separated by the first region of the diffusion; and (e) siliciding the exposed silicon in the second region of the diffusion, such that a silicided first contact area and a silicided second contact area are formed.

As noted from the above outline, this embodiment omits the implantation and subsequent out diffusion of a dopant into a polysilicon layer in order to cover the body of the diffusion region for subsequent silicidation of the contact areas. Again, generally stated, the present invention comprises a diffusion resistor structure having silicided contact areas and a controlled resistivity in the body of the diffusion resistor. The controlled resistivity is attained by protecting the body of the diffusion resistor during the silicidation process. Those skilled in the art will recognize that other approaches to achieving this general concept are possible. The chip process within which the diffusion resistor structure is to be incorporated would probably control which particular process and resultant structure are selected.

Advantageously, the overlaying polysilicon or oxide layer does not significantly effect resistivity of the main body portion of the diffusion resistor. Further, dependent upon the semiconductor fabrication process with which the diffusion resistor structure is to be integrated, no additional masking steps may be required. For example, a diffusion resistor structure in accordance with this invention may be fabricated for a dynamic random access memory (DRAM) chip or DRAM/logic chip in accordance with present technology, without requiring additional mask steps.

While the invention has been described in detail herein in accordance with certain preferred embodiments thereof, many modifications and changes therein may be effected by those skilled in the art. For example, those skilled in the art should recognize that the novel concepts presented herein could be readily employed in other integrated circuit chips than those discussed. Accordingly, it is intended by the appended claims to cover all such modifications and changes as fall within the true spirit and scope of the invention.

I claim:

1. A method for fabricating a diffusion resistor structure, said method comprising the steps of:

(a) forming an isolated, resistor-shaped diffusion in a semiconductor structure adjacent to an upper surface thereof;

(b) forming a diffusion barrier layer over said semiconductor structure, said diffusion barrier layer being patterned such that a first region of said diffusion is exposed at said upper surface of said semiconductor structure, while a second region of said diffusion underlies said diffusion barrier layer;

(c) forming a polysilicon layer over said diffusion barrier layer and said first region of said diffusion;

(d) diffusing dopant from said first region into said polysilicon layer, thereby forming a doped polysilicon region, wherein said diffusion barrier layer prevents diffusion of said dopant from said diffusion into that portion of said polysilicon layer extending over the diffusion barrier layer, thereby defining an undoped polysilicon region;

(e) forming an oxide layer over said doped polysilicon region; and (f) removing said diffusion barrier layer, and siliciding said second region of said diffusion from said upper surface of said semiconductor structure, said second region comprising a first contact area and a second contact area, said first contact area and said second contact area being separated by said first region of said diffusion, wherein said first contact area comprises a first silicided contact area and said second contact area comprises a second silicided contact area, and wherein electrical contact is made to said diffusion resistor structure through said first silicided contact area and said second silicided contact area.

2. The method of claim 1, further comprising subsequent to said diffusing step (d), removing said undoped polysilicon region such that only said doped polysilicon region remains.

3. The method of claim 2, wherein said removing of said undoped polysilicon region comprises wet etching.

4. The method of claim 2, wherein said removing of said undoped polysilicon region comprises etching with potassium hydroxide/isopropyl alcohol.

5. The method of claim 2, wherein said removing of said undoped polysilicon region comprises etching with ethylenediamine, pyrocatechol and water.

6. The method of claim 3, wherein said diffusion barrier layer comprises nitride and wherein said forming step (e) comprises oxidizing said doped polysilicon region.

7. The method of claim 1, wherein said forming step (b) comprises forming a layer of nitride over said semiconductor structure, and patterning and etching said nitride such that said first region of said diffusion is exposed at said upper surface of said semiconductor structure, said layer of nitride comprising said diffusion barrier layer.

8. The method of claim 1, further comprising prior to said step (c), implanting a Boron dopant into said diffusion in said semiconductor structure.

9. The method of claim 8, wherein said diffusing step (d) comprises heating said semiconductor structure to cause Boron to out diffuse from the first region of said diffusion into said polysilicon layer.

10. The method of claim 1, wherein said diffusion comprises a P-type diffusion in said semiconductor structure.

11. The method of claim 1, wherein said removing step (f) comprises reactive ion etching said nitride to remove said nitride from the upper surface of said semiconductor structure in said second region of said diffusion, and subsequently depositing and annealing titanium on said second region of said diffusion, thereby forming a silicide layer integral with said first contact area and said second contact area of said second region.

12. A method for fabricating a diffusion resistor structure, said method comprising the steps of:

(a) forming an isolated, resistor-shaped diffusion in a semiconductor structure from an upper surface thereof;

(b) forming a mask layer over said diffusion;

(c) patterning and removing a portion of said mask layer to expose a first region of said diffusion at said upper surface of said semiconductor structure;

(d) after said patterning and removing, growing by thermal oxidation an oxide layer above said first region of said diffusion;

(e) removing said mask layer from overlying a second region of said diffusion, said second region including a first contact area and a second contact area, said first contact area and said second contact area being separated by said first region of said diffusion; and (f) siliciding said first contact area and said second contact area of said second region of said diffusion, thereby producing a first silicided contact area and a second silicided contact area, wherein electrical contact is made to said diffusion resistor structure through the first silicided contact area and the second silicided contact area.

13. A method for fabricating a diffusion resistor structure, said method comprising the steps of:

(a) forming an isolated, resistor-shaped diffusion in a semiconductor structure from an upper surface thereof;

(b) forming a mask layer over said diffusion;

(c) patterning and removing a portion of said mask layer to expose a first region of said diffusion at said upper surface of said semiconductor structure;

(d) forming an oxide layer above said first region of said diffusion;

(e) removing said mask layer from overlying a second region of said diffusion, said second region including a first contact area and a second contact area, said first contact area and said second contact area being separated by said first region of said diffusion;

(f) siliciding said first contact area and said second contact area of said second region of said diffusion, thereby producing a first silicided contact area and a second silicided contact area, wherein electrical contact is made to said diffusion resistor structure through the first silicided contact area and the second silicided contact area; and wherein said mask layer comprises a nitride layer and wherein said removing step (e) comprises reactive ion etching said nitride to remove said nitride from the upper surface of said semiconductor structure above said second region of said diffusion.

14. A method for fabricating a diffusion resistor structure, said method comprising the steps of:

(a) forming an isolated, resistor-shaped diffusion in a semiconductor structure from an upper surface thereof;

(b) forming a mask layer over said diffusion;

(c) patterning and removing a portion of said mask layer to expose a first region of said diffusion at said upper surface of said semiconductor structure;

(d) forming an oxide layer above said first region of said diffusion;

(e) removing said mask layer from overlying a second region of said diffusion, said second region including a first contact area and a second contact area, said first contact area and said second contact area being separated by said first region of said diffusion;

(f) siliciding said first contact area and said second contact area of said second region of said diffusion, thereby producing a first silicided contact area and a second silicided contact area, wherein electrical contact is made to said diffusion resistor structure through the first silicided contact area and the second silicided contact area; and wherein said siliciding step (f) comprises depositing and annealing titanium on said second region of said diffusion, thereby forming titanium silicide integral with said second region.

* * * * *